United States Patent
Mueller et al.

(10) Patent No.: US 9,581,622 B2
(45) Date of Patent: Feb. 28, 2017

(54) TEMPERATURE COMPENSATED FIBER-OPTIC CURRENT SENSOR

(71) Applicant: ABB Research Ltd., Zurich (CH)

(72) Inventors: Georg Mueller, Glattpark (CH); Andreas Frank, Zurich (CH); Klaus Bohnert, Oberrohrdorf (CH); Xun Gu, Neuenhof (CH)

(73) Assignee: ABB Research Ltd., Zurich (CH)

( * ) Notice: Subject to any disclaimer, the term of this patent is extended or adjusted under 35 U.S.C. 154(b) by 106 days.

(21) Appl. No.: 14/589,745

(22) Filed: Jan. 5, 2015

(65) Prior Publication Data

US 2015/0115934 A1 Apr. 30, 2015

Related U.S. Application Data

(63) Continuation of application No. PCT/EP2013/064095, filed on Jul. 4, 2013.

(30) Foreign Application Priority Data

Jul. 5, 2012 (EP) .................................. 12175142

(51) Int. Cl.
*G01R 31/00* (2006.01)
*G01R 19/32* (2006.01)
*G01R 15/24* (2006.01)

(52) U.S. Cl.
CPC ........... *G01R 19/32* (2013.01); *G01R 15/246* (2013.01); *G01R 15/247* (2013.01)

(58) Field of Classification Search
CPC .... G01R 15/246; G01R 15/247; G01R 19/32; G01R 33/32; G01R 33/322; G02B 21/00;

(Continued)

(56) References Cited

U.S. PATENT DOCUMENTS

2005/0083033 A1* 4/2005 Kurosawa ............ G01R 15/246
324/96
2007/0065156 A1 3/2007 Lin et al.
(Continued)

FOREIGN PATENT DOCUMENTS

EP 1115000 A2 7/2001
WO 2007121592 A1 11/2007

OTHER PUBLICATIONS

Jones, "A New Calculus for the Treatment of Optical Systems", J.O.S.A. vol. 31, Jul. 1941, pp. 488-493.

(Continued)

*Primary Examiner* — Minh N Tang
(74) *Attorney, Agent, or Firm* — Whitmyer IP Group LLC

(57) ABSTRACT

In a fiber-optic current sensor, a 22.5° Faraday rotator, which is part of the sensing fiber coil, determines the working point of the sensor. The coil is operated with substantially linearly polarized light or incoherent substantially left and right circularly polarized light waves. In one arrangement, a polarization beam splitter generates two optical signals that vary in anti-phase with changing current. A signal processor determines the current from the two anti-phase signals. Appropriately detuned and oriented fiber-optic half-wave or quarter-wave retarders before the fiber coil are used to reduce or cancel the adverse effects of temperature and bend-induced birefringence on the measurement signal. Moreover, the temperature may be derived from the difference in the bias of the anti-phase signals and may be used to cancel temperature effects in the signal processor.

20 Claims, 8 Drawing Sheets

(58) Field of Classification Search
CPC ........ G02B 21/06; G02B 21/32; G02B 21/76; G02B 21/972; G02F 1/36; G02F 1/116
See application file for complete search history.

(56) References Cited

U.S. PATENT DOCUMENTS

| | | | |
|---|---|---|---|
| 2007/0273358 A1* | 11/2007 | Kurosawa | G01R 15/246 324/96 |
| 2010/0253320 A1 | 10/2010 | Kurosawa | |
| 2011/0115469 A1* | 5/2011 | Kondo | G01R 15/245 324/96 |

OTHER PUBLICATIONS

Laming, et al., "Electric Current Sensors Employing Spun Highly Birefringent Optical Fibers", Journal of Lightwave Technology, vol. 7, No. 12, Dec. 1989, pp. 2084-2094.

Kurosawa, et al., "Flexible Fiber Faraday Effect Current Sensor Using Flint Glass Fiber and Reflection Scheme", IEICE Trans Electron, Mar. 2000, pp. 326-330.

Lin, et al, "Modified in-line Sagnac Interferometer with Passive Demodulation Technique for Environmental Immunity of a Fiber-Optic Current Sensor", Applied Optics, May 1999, pp. 2760-2766.

Briffod, et al., "Polarimetric Current Sensor Using an In-Line Faraday Rotator", IEICE Trans Electron, Mar. 2000, pp. 331-335.

Frosio, et al., "Reciprocal Reflection Interferometer for a Fiber-Optic Faraday Current Sensor", Applied Optics, Sep. 1994, pp. 6111-6122.

Bohnert, et al., "Temperature and Vibration Insensitive Fiber-Optic Current Sensor", Journal of Lightwave Technology, Feb. 2002, pp. 267-276.

Ren, et al., "Temperature Dependence of bend- and twist-induced birefringence in a low-birefringence fiber", Optics Letters, Jan. 1988, pp. 62-64.

* cited by examiner

TEMPERATURE COMPENSATED FIBER-OPTIC CURRENT SENSOR

FIELD OF THE INVENTION

The invention relates to a fiber-optic current sensor having a light source, a linear polarizer, a sensing fiber, a Faraday rotator, a mirror and at least one detector.

BACKGROUND OF THE INVENTION

Fiber-optic current sensors commonly rely on the Faraday effect in an optical glass fiber. The fiber forms at least one loop around a conductor that carries the current to be measured. The Faraday effect is observed either as a rotation of the polarization of linearly polarized light or equivalently as differential phase shift between left and right circularly polarized light waves. Sometimes the two sensor versions are referred to as polarimetric and interferometric sensors, respectively. Advantageously, the fiber is operated in a reflective mode, i.e. the light performs a roundtrip through the fiber coil.

The magneto-optic polarization rotation or phase shift is converted to a change in light intensity by means of a polarizer. In order to get a linear variation of the light intensity as a function of current, it is necessary to introduce a 45° bias to the polarization angle, if the polarization rotation is detected, or a 90° phase bias, if the phase shift is measured. Frosio et al. [1] have applied the method of non-reciprocal phase modulation known from fiber gyroscopes [2] to dynamically generate a 90° phase bias by means of a phase modulator in interferometric sensors. Alternatively, the phase bias can be generated in a passive manner by means of a quarter wave retarder [1]. [3] describes a detection scheme with several detection channels that are anti-phase and/or at quadrature to each other also using passive retarders. The scheme allows compensation of certain imperfections such as temperature dependent signal bias and variation in the interference fringe visibility.

F. Brifford et al. [4] and K. Kurosawa et al. [5] describe a method where the 45° bias angle for linearly polarized light in polarimetric sensors is generated by a 22.5° in-line Faraday rotator. The light passes the rotator twice during its roundtrip through the sensor which results in the 45° bias rotation. In a similar arrangement, H. Lin et al. [6] use a 22.5° in-line Faraday rotator to introduce a 90° phase offset between left and right circular polarized light waves.

US patent application US2007/0273358A1 [7] teaches a method to compensate the temperature dependence of the Verdet constant in a sensor according to Ref. [5] by making use of the temperature dependence of the rotation angle of the Faraday rotator. US patent application US 2010/0253320 A1 [8] discloses a method to account up to first order for the temperature dependence of a sensor according to Ref. [5] by means of signal processing, or up to higher orders by means of signal processing and an additional temperature sensor. [9] describes a method to compensate the temperature dependence of the Faraday effect in interferometric sensors with non-reciprocal phase modulation. Here, the fiber-optic quarter-wave retarder that generates the circular light waves is prepared in a way that the temperature effect from the retarder balances the temperature effect from the Verdet constant.

K. Bohnert et al. in J. of Lightwave Technology, Vol. 20, No. 2, pp. 267-276 describes a device with non-reciprocal phase modulation, wherein temperature compensation in the non-reciprocal phase modulation scheme has been done by detuning the quarter wave retarder.

State-of-art interferometric fiber-optic current sensors with non-reciprocal phase modulation are high-end sensors with excellent accuracy for both alternating and direct currents. On the other hand they require sophisticated and expensive means to measure the magneto-optic phase shift, such as an integrated-optic phase modulator with closed-loop electronics. Moreover, the fiber connecting the opto-electronics module (comprising the light source, photo-detectors, signal processing electronics, etc) and the sensing fiber coil is a polarization-maintaining specialty fiber. Cables and connectors for such fibers are demanding and expensive.

The performance of simpler sensors with passive detection schemes is often not sufficient for applications in electric power transmission and distribution, particularly due to disturbing effects of temperature.

SUMMARY OF THE INVENTION

The problem to be solved by the present invention is therefore to provide a temperature compensated fibre-optic current sensor of the type described above, and for a method for current measurement using such a current sensor. This problem is solved by the current sensor and method for current measurement of the independent claims. Exemplary embodiments are given by the dependent claims and any combinations thereof.

The current sensor shall comprise:
a light source,
a first linear polarizer receiving light from said light source and generating polarized light, and
a sensor head with
  a retarder receiving light from said polarizer and having a retardation, i.e. a phase retardation between linear orthogonal polarization modes in the retarder, of $90°+\Delta\rho+N\cdot180°$ or $180°+\Delta\rho+N\cdot180°$ with retarder detuning $\Delta\rho\neq0$ and N being an integer number $\geq0$,
  a sensing fiber arranged to receive light from said retarder, wherein said sensing fiber is adapted to be looped at least once around a conductor carrying a current to be measured,
  a mirror arranged to receive light from said sensing fiber, and
  a Faraday rotator arranged between said retarder and said mirror, wherein the Faraday rotator rotates the light by $(22.5°+M\cdot45°)\pm10°$, with M being an integer number $\geq0$.

The sensor further comprises at least one detector adapted to measure at least one signal of light returning from the sensor head through said first linear polarizer.

This arrangement allows to couple substantially linearly polarized light or incoherent substantially left and right circularly polarized light into the sensing fiber. The detuning of the quarter-wave or half-wave retarder by an amount $\Delta\rho$ allows to compensate (at least in first approximation) the temperature dependence of the measured signals.

The absolute detuning angle $|\Delta\rho|$ at room temperature is advantageously in a range between 1° and 30°, in particular between 1° and 15°.

In one embodiment, the retarder can be a detuned half-wave retarder, i.e. it has a retardation of $180°+\Delta\rho+N\cdot180°$. In this case, in one advantageous embodiment, the retarder has principal axes arranged under an angle $45°\pm10°$ in respect to a polarization direction of said polarized light, i.e. the light exiting the retarder is still substantially linearly polarized (apart from the phase shift introduced by $\Delta\rho$), in particular if the polarized light is incident on the retarder without prior change to its polarization state.

In another embodiment, the sensor can further comprise a birefringent element, such as a birefringent, polarization-maintaining fiber, arranged between the polarizer and the retarder. The birefringent element has principal axes arranged at $45°\pm10°$ in respect to the polarization direction of the polarized light from the polarizer. It introduces a differential group delay exceeding the coherence length of the light, such that the two linearly polarized light waves exiting from the birefringent element are mutually incoherent. Further, the retarder's principal axes are at an angle of $45°\pm10°$ with respect to the principal axes of the birefringent element. Thus, the retarder generates two orthogonal, non-coherent substantially circularly polarized light waves (if the retarder is a detuned quarter-wave retarder) or two non-coherent, substantially linearly polarized light waves (if the retarder is a detuned half-wave retarder).

In the second case, as shown below, the retarder's length can be chosen such that it compensates at least partially for the temperature dependence of the Verdet constant of the sensing fiber and for the quadratic temperature dependence of the rotation generated by the Faraday rotator. In all other cases, the retarder's length can be selected to compensate at least for the (linear) temperature dependence of the Verdet constant of the sensing fiber. In both cases, the retarder's length can also be chosen by further taking into account the temperature dependence of the birefringence of said sensing fiber, such that it also compensates the same.

If the looped sensing coil is arranged in a plane, the normal to said plane (i.e. the axis of the coil(s)) is advantageously arranged at an angle of $45°\pm10°$ to the principal axes of the retarder. This alignment reduces the influence of the bend-induced birefringence.

The Faraday rotator rotates the light advantageously by $22.5°+M\cdot45°\pm10°$, with M being an integer number, thus generating a roundtrip rotation of approximately 45° (+a possible multiple of 90°).

If the sensor is operated within a comparatively small temperature range, it may be sufficient if it has a single detection channel only. However, advantageously, it comprises a first photodetector detecting returning light polarized parallel to the polarization direction of the (outgoing) polarized light and a second photodetector detecting returning light polarized perpendicularly to the polarization direction of the (outgoing) polarized light.

Any angles given in respect to retardation and phase shifts are understood to apply to the center wavelength of the light coming from the light source at room temperature.

When operating the sensor in order to measure a current, the retarder is advantageously kept at the same temperature (e.g. within $\pm10°$ C.) as the sensing fiber such that it reliably compensates the temperature dependence of the Verdet constant of the fiber.

Other advantageous embodiments are listed in the dependent claims as well as in the description below.

BRIEF DESCRIPTION OF THE DRAWINGS

The invention will be better understood and objects other than those set forth above will become apparent from the following detailed description thereof. Such description makes reference to the annexed drawings, wherein.

DETAILED DESCRIPTION OF THE INVENTION

Definitions

Terms of the type "substantially circularly polarized light" and similar used herein designates light that can be generated by a superposition of two collinear, coherent, orthogonal, linearly polarized light waves of equal amplitude and a mutual phase shift of $90°+K\cdot180°+\Delta\alpha$, with K being an integer number and Δα being between −30° and +30°, in particular between −15° and 15°. (Δα=0° corresponds to perfect circular polarization.)

Terms of the type "substantially linearly polarized light" and similar used herein designates light that can be generated by a superposition of two collinear, coherent, orthogonal, linearly polarized light waves of equal amplitude and a mutual phase shift of K·180°+Δα, with K being an integer number and Δα being between −30° and +30°, in particular between −15° and 15°. (Δα=0° corresponds to perfect linear polarization.)

1. Prior Art Approach

Figure 1:
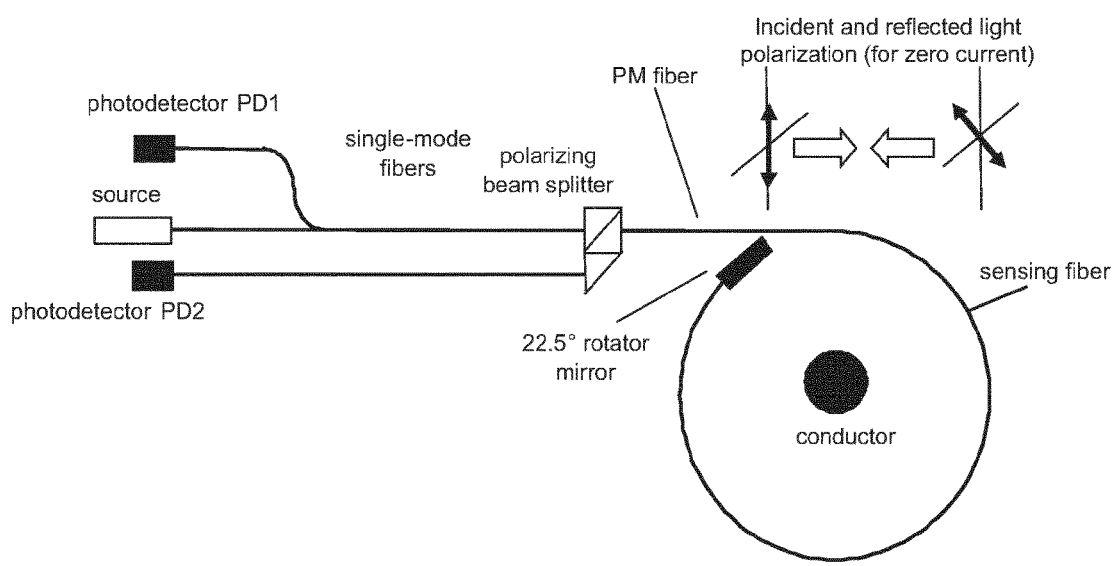
FIG. 1 shows the basic layout of a sensor.

The basic sensor layout of the sensor underlying the disclosed invention is depicted in FIG. 1: Depolarized light from a preferably broadband light source, such as a superluminescent diode, propagates through a single-mode fiber to the sensing fiber coil. Before entering the sensing coil, the light waves are projected onto the required polarization state (i.e. a principal axis of the polarization-maintaining (PM) fiber) by means of a polarizer (or polarizing beam splitter (PBS) as in FIG. 1), which forms a first and a second linear polarization having polarization directions orthogonal to each other. The PM fiber carries the linearly polarized light from the PBS to the sensing fiber. Alternatively, the sensing fiber coil may be attached directly to the PBS. The fiber coil made of low-birefringent fiber is looped at least once around a conductor carrying the current I to be measured. Linearly polarized light is coherently composed of left and right circularly polarized light. These circular polarization states encounter different dispersion, i.e. different velocities, in the sensing fiber due to the magneto-optical birefringence originating from the current-induced magnetic field. This becomes manifest in a rotation of the plane of linear light polarization known as Faraday effect. The light is reflected at the end of the sensing fiber and the rotation is subsequently converted into a change in the light intensities at the two ports of the polarizing beam splitter that are measured by means of the photodetectors PD1 and PD2.

Furthermore, a 22.5° Faraday rotator is placed in the sensing fiber to introduce an optical bias, i.e. an additional phase shift between left and right circular polarization states that changes the sensitivity of this setup around zero current from a local minimum to a local maximum. In fact, the presented configurations employ a Faraday rotation mirror (FRM) at the end of the sensing fiber. The rotator mirror e.g. consists of a collimating lens, e.g. a graded-index lens, a Faraday rotator, and a mirror. The rotator element itself consists of a magnetic material, such as magnetically saturated Yttrium Iron Garnet (YIG). A permanent magnet produces the required magnetic field. The lens collimates the light exiting the sensing fiber and couples the reflected light back into the fiber. The rotator rotates the plane of polarization by 22.5° during a single pass (or alternatively by 22.5°+M×45°, where m is an integer number). The roundtrip rotation due to the FRM $\alpha_{FRM}$ is thus 45° (+M×90°). The reflected light passes the sensing fiber a second time and the linearly polarized probe light arrives at the end of the sensing fiber with the polarization rotated about 45° with respect to the incident light polarization plane in absence of current and effects of other birefringence in the sensing fiber. If a current I is present in the conductor, there is an additional Faraday rotation of the plane of linear light polarization of $$\phi_F = 2 \cdot V \cdot n \cdot I, \quad (1)$$

wherein V is the Verdet constant of the sensing fiber (around 1 μrad/A at 1310 nm for fused silica fiber) and n is the number of fiber loops of the sensing coil. The total rotation angle α of linear polarized light is then given by (still neglecting effects of linear birefringence in the sensing fiber):

$$\alpha = \alpha_{FRM} + \phi_F. \quad (2)$$

The two signals $S_1$ and $S_2$ (optical power) at the two photodetectors vary in proportion to the square of the cosine of α and the square of the cosine of α−90° respectively. Since the polarization directions of the two PBS detector ports are orthogonal to each other, $S_1$ and $S_2$ are in anti-phase with respect to variations in α:

$$S_1 = S_o \cos^2 \alpha, \quad (3)$$

$$S_2 = S_o \cos^2(\alpha - \pi/2) \quad (4)$$

or $$S_{1,2} = \frac{1}{2} S_o [1 \pm \cos 2(\alpha_{FRM} + \phi_F)], \quad (5)$$

and with $\alpha_{FRM} = 45°$:

$$S_{1,2} = \frac{1}{2} S_o [1 \pm \sin 2\phi_F]. \quad (6)$$

The signal amplitude $S_o$ is proportional to the source power.

Taking the difference of the two signals and dividing the result by their sum results in a normalized signal S that is independent of $S_o$ and the source power:

$$S = [1 \pm \sin 2\phi_F]. \quad (7)$$

It is apparent that the sensitivity to current, given by the derivative of $S_{1,2}$ with respect to $\phi_F$, is maximized due to the additional polarization rotation by the Faraday rotator. This point is further elucidated in FIG. 2a where the normalized signals of the two photodetectors for the configuration of FIG. 1 are plotted as a function of electrical current (bending-induced birefringence δ neglected). The maximum currents of ±100 kA correspond to Faraday rotation angles of about ±45°. These characteristic curves have the steepest slope, i.e. the highest sensitivity, at zero current. For comparison FIG. 2b shows the corresponding curves for a sensor without a 22.5° Faraday rotator ($\alpha_{FRM} = 0$). The presented curves are calculated by means of the Jones matrix formalism [10], as all other curves given in this document.

Note 1: In the exemplary calculations for all configurations presented in this document, unless otherwise noted, the following parameters are used: sensing fiber diameter d=125 μm, sensing fiber coil diameter D=170 mm, sensing fiber length 2136 mm (N=4 windings), temperature dependence of the Faraday rotator $d\alpha_{FRM}/dT = -0.03°/K$ ($\alpha_{FRM} = 45°$ at room temperature), temperature dependence of the retarder $1/\rho(d\rho/dT) = -2.2 \cdot 10^{-4}/K$, Verdet constant at room temperature (λ=1310 nm) $V = 1.0 \cdot 10^{-6}$ rad/A, temperature dependence of the Verdet constant $1/V(dV/dT) = 7.1 \cdot 10^{-5}/K$, bending induced birefringence (if not neglected): δ=0.5 rad $(d/D)^2/\lambda$.

However, there are several effects, particularly due to temperature, that can severely reduce the performance of this basic sensor configuration. As a result, the sensor of FIG. 1 may be unsuited for applications in substations for electric power transmission and distribution where commonly extended temperature ranges of operation are encountered. In the following, several techniques are described how to eliminate or at least substantially diminish such disturbing effects for various sensor configurations. Particularly the following effects are considered:

The Verdet constant V varies with temperature with a temperature coefficient of about $(1/V)\, dV/dT=0.7\cdot 10^{-4}/K$ and generally results in a linear variation of the detection sensitivity.

Figure 2A:
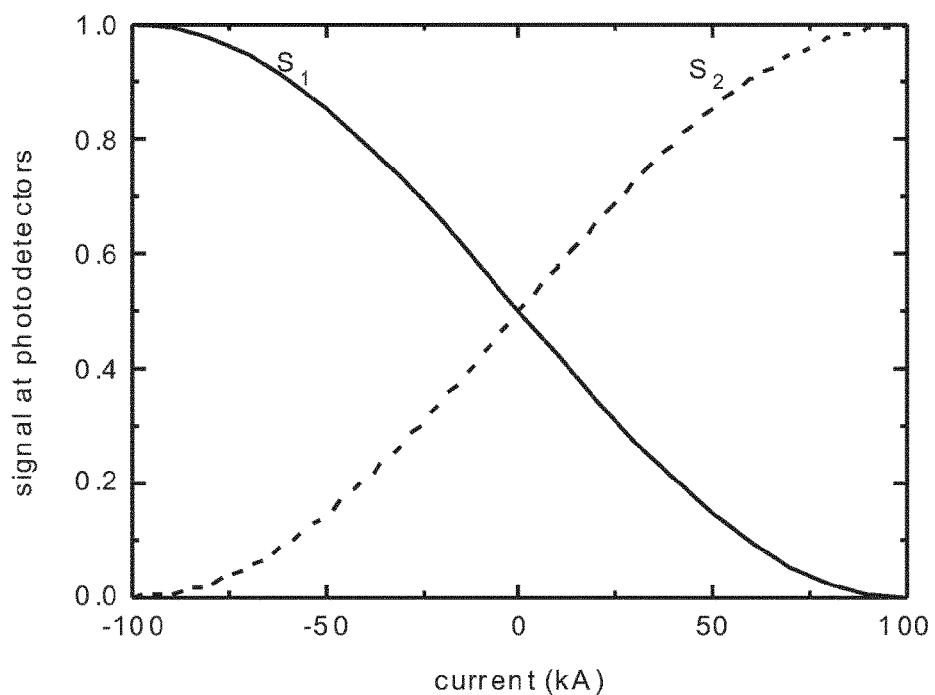
FIG. 2a shows the calculated signal as a function of current with a 22.5° degree Faraday rotator within the sensing fiber the Faraday rotator introduces an optical bias that increases the detection sensitivity around zero current.
Figure 2B:
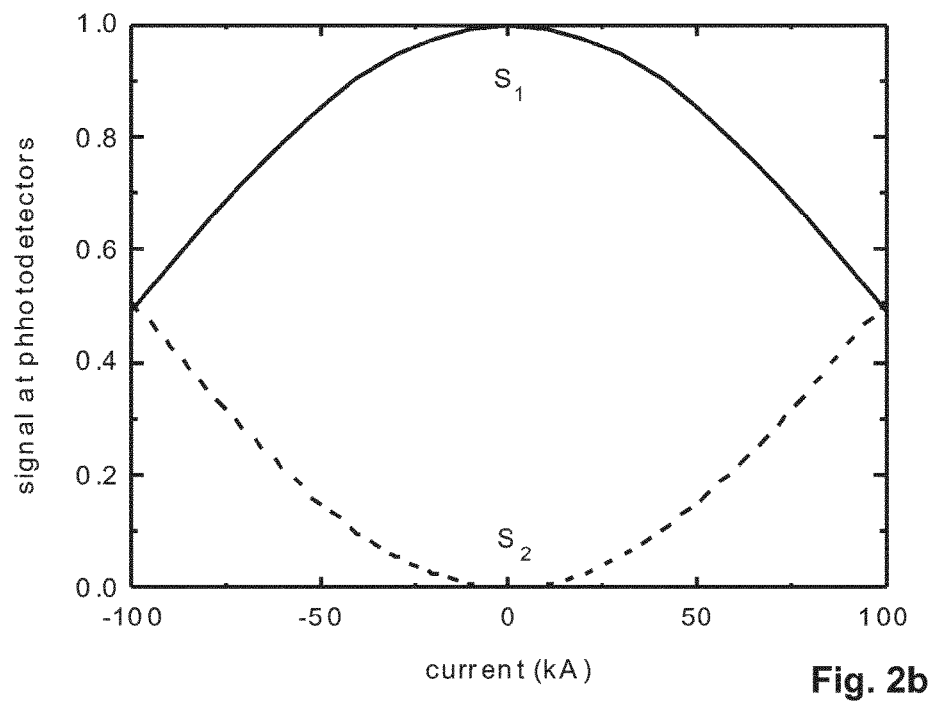
FIG. 2b shows the calculated signal as a function of current without a 22.5° degree Faraday rotator.

The optical bias $\alpha_{FRM}$ changes linearly with temperature of the Faraday rotator (typically $d\alpha_{FRM}/dT=-0.03/K$ for $\alpha_{FRM}=45°$ at room temperature) and, accordingly, the two photodetector signals at zero current (working points) are no longer identical and the crossing point of the curves in FIG. 2a of the described current sensor shifts linearly with temperature to smaller or larger currents. Correspondingly, a change of temperature cannot be distinguished from a DC electrical current applied in the enclosed conductor and this sensor configuration cannot be used without temperature stabilization of the Faraday rotator to measure DC electrical currents. Temperature stabilization on high voltage potential is commonly not a practical option, however. Accordingly, the disclosed techniques refer in the following to measurements of AC or transient currents if not explicitly stated otherwise.

Moreover, the shift of the characteristic curves in FIG. 2a with temperature becomes manifest in a second order temperature dependence of the detected Faraday phase shift due to the decrease in the slope at zero current, as the crossing point moves away from zero current.

Bending the sensing fiber generates bend-induced birefringence which alters the polarization state of the light in the fiber and thus alters the effective Faraday effect. The bend-induced birefringence is again temperature-dependent.

The attenuation of the optical power in the two detection channels may differ (e.g. due to differing insertion loss at fiber pigtails or loss at connectors) and may differently vary as a function of time and temperature with the result of different amplitudes $S_o$ of two detected signals.

2. Sensor Configuration A

Figure 3:
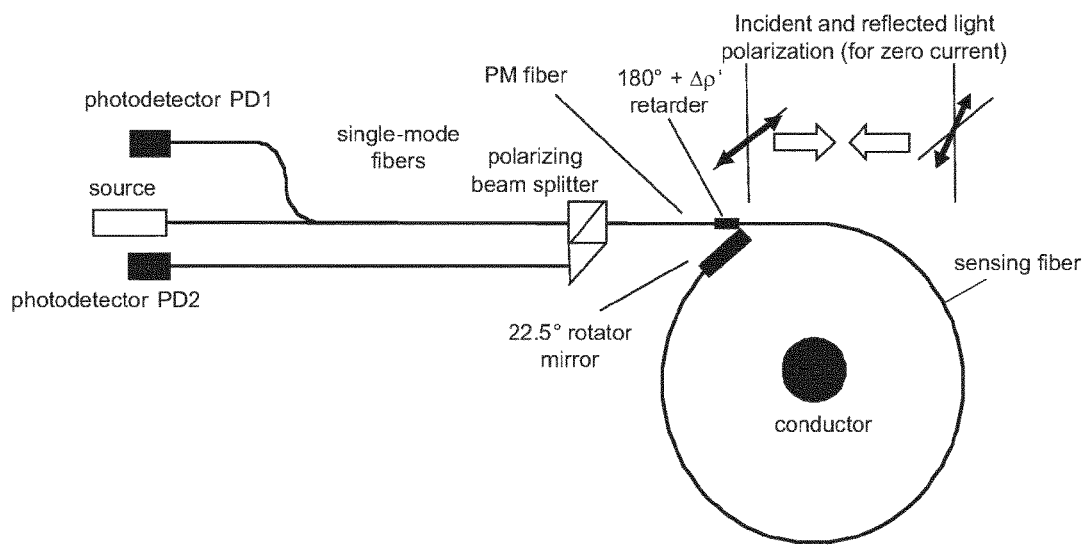
FIG. 3 shows embodiment A of the present invention.

FIG. 3 depicts the layout of sensor configuration A of the disclosed invention. This embodiment solves the issues raised in the previous section to a large extent. The configurations B and C presented in the following sections are based on the same basic idea and solve these issues as well, but rely in addition on somewhat modified working principles.

As in FIG. 1, the PM fiber section after the PBS is aligned with one of its principal axes parallel to the polarization direction of the forward-propagating light exiting from the PBS. A non-perfect half-wave retarder is inserted after the PM fiber section. (In this context "non-perfect" means that the retardation deviates by an intentional amount from perfect half wave retardation). This birefringent half-wave retarder is fabricated from a PM fiber section whose length roughly corresponds to half a beat length $L_b$ (or integer multiples of $L_b/2$), i.e. to a retardation of $\rho=180°$ (or integer multiples of 180°), and whose axes are oriented with an orientation of 45° to the axis of the PM fiber. This half-wave retarder represents an optical element with further temperature dependence, but has no other effect on the working principle discussed above. As pointed out in the following, the actual deviation from $\rho=180°$, $\Delta\rho$, is optimized to compensate the aforementioned unwanted influences from temperature dependent behavior. Note that in configuration A the PM fiber only guides the light to and from the retarder but as a matter of principle could be omitted and the half-wave retarder could be attached directly to the PBS.

Figure 4:
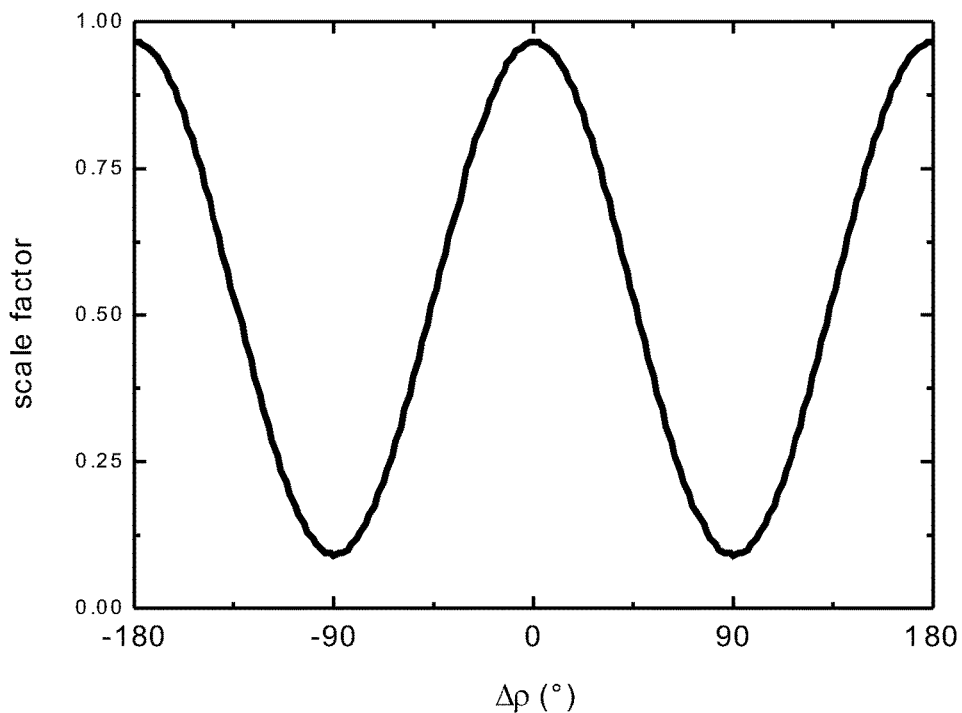
FIG. 4 shows the scale factor of sensor configuration A as a function of retardation $\Delta\rho=\rho-180°$.

FIG. 4 depicts the scale factor in normalized units of sensor configuration A as a function of the deviation $\Delta\rho=\rho-180°$ of the retarder from a perfect half-wave retarder (with parameters as listed in the Note 1 above). This scale factor describes the ratio (in normalized units) of the measured Faraday rotation and applied current and is deduced from the numeric calculations as the slope in the sensor response at zero current (see FIG. 2a). (Variations in the scale factor at high currents as a result of the sinusoidal response function can be compensated by signal processing). In FIG. 4, the scale factor is normalized to unity for $\Delta\rho=0$ and $\delta=0$.

Preferably, the normal of the sensing coil plane is aligned at 45° to the retarder axes as this choice reduces the influence of bend-induced birefringence. Deviations from this angle move the maxima and minima in FIG. 4 away from the positions at multiples of 90°. In principle, an angular misalignment can be compensated for by an appropriate deviation from perfect half-wave retardation. Note that the minima in FIG. 4 (at odd multiples of 90°) do not reach zero as a result of the finite bend-induced birefringence in the sensing fiber. For the same reason, the maxima do not attain unity.

Figure 5:
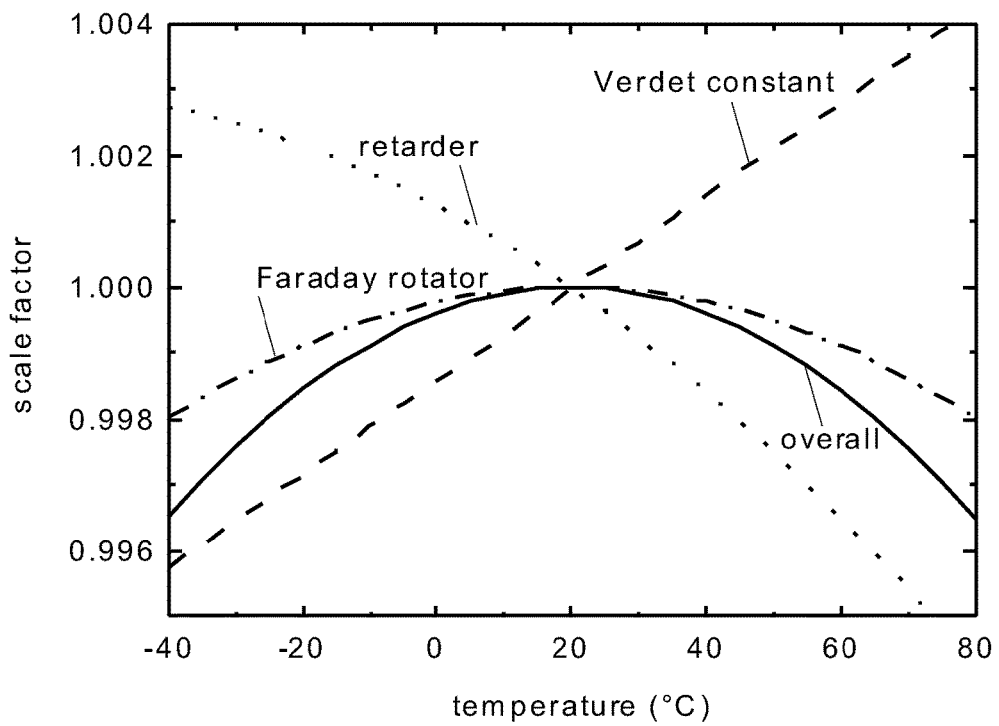
FIG. 5 shows the contributions to the temperature dependence of the scale factor and overall temperature dependence for sensor configuration A with $\Delta\rho=-3.3°$.

The retardation $\rho$ of the retarder varies with temperature and results in a variation of the scale factor. For the calculations a temperature coefficient $(1/\rho)(d\rho/dT)=-2.2\cdot 10^{-4} K^{-1}$ is assumed, which is a value measured for an elliptical core PM fiber. Choosing an appropriate value $\Delta\rho$ at room temperature enables adjusting the overall temperature dependence. The Jones matrix calculations reveal that a value of $\Delta\rho=0°$ results only in a small second order temperature contribution of the retarder to the overall temperature dependence. The total temperature dependence is then essentially determined by the contributions of the Verdet constant and rotator mirror. With a value of $\Delta\rho=-3.3°$ the retarder contribution contains a term that varies linearly with temperature and compensates the (linear) variation with temperature in the Verdet constant (assuming temperature coefficients as specified in the Note 1 above). As a result the relative scale factor variation is reduced from 0.84% to 0.35% in the range from −40 to 80° C. The overall temperature dependence of the scale factor as well as the individual contributions are plotted in FIG. 5. Here, the scale factor is normalized to unity at room temperature. Note 2: The (small) contribution of the temperature dependence of the bend-induced birefringence is neglected in FIG. 5 as well as in all further calculations.

Figure 6:
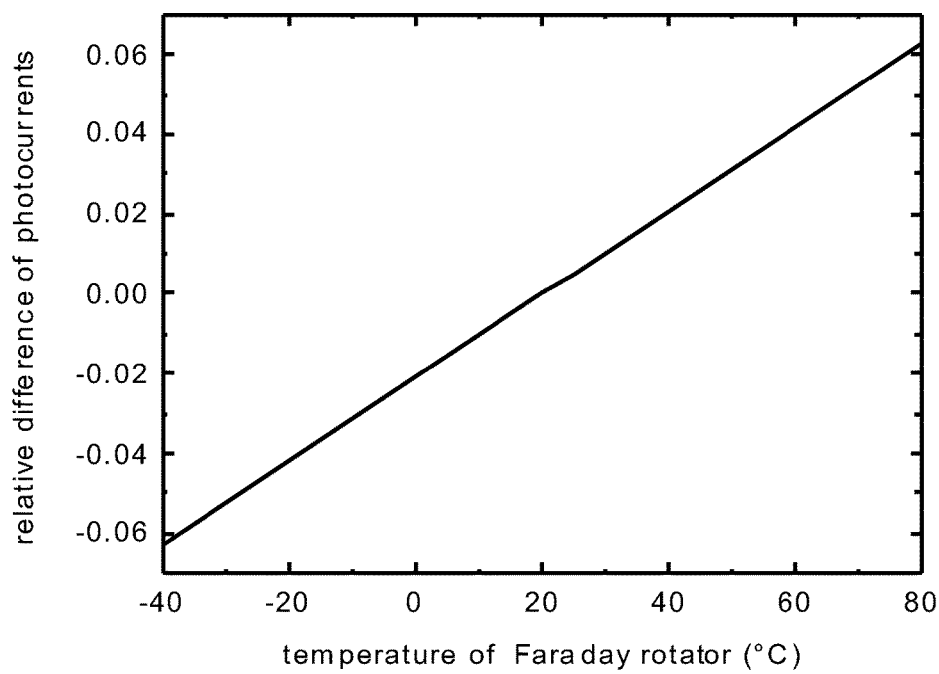
FIG. 6 shows how the normalized difference in the two DC signals varies linearly with temperature and enables a measurement of the temperature as long as no DC electrical currents are applied.

Alternatively to the temperature compensation by means of a half-wave retarder, the temperature dependence of the sensor can also be compensated by extracting the temperature of the fiber coil from the DC offsets of the two photodetector signals. The actual temperature compensation is then done in the signal processor. The DC offsets vary with the temperature of the rotator mirror (and thus of the fiber coil) due to the temperature dependence of the rotation angle. The difference of the two DC offsets divided by their sum (FIG. 6) is thus a measure for coil temperature (independent of source power variations). The method can only be applied for the measurement of alternating currents, because the effects of temperature and direct currents cannot be distinguished. The method can also be used in combination with the first method in order to compensate the residual temperature of that method.

Moreover, the temperature of the fiber coil can also be measured by means of electric or optical or other temperature sensors.

Equivalently to a change of a temperature, variations in probe light wavelength become manifest in an altered rotation angle of the Faraday rotation mirror and, thus, result as well in a first order variation of the working points and a second order variation of the scale factor in addition to the wavelength dependence of the Verdet constant in the sensing fiber. The source wavelength may vary, e.g., with environmental temperature in cases where the source is not temperature-stabilized, e.g. by a thermo-electric cooler. The method described in the previous paragraph to compensate temperature effects during signal processing can simultaneously compensate the effects of changed probe wavelength stemming from the Faraday rotator. Accordingly, the disclosed sensor configurations enable usage of non temperature-stabilized light sources that usually show a pronounced wavelength dependence on temperature, e.g. if the temperature of the Faraday rotator is measured by additional temperature sensors.

If the temperature of the Faraday rotator and thus the DC offsets in the signals are stabilized, the disclosed invention further enables measurement of DC currents, provided the differential optical loss of the two detection channels is sufficiently temperature-independent.

The disclosed signal evaluation and processing requires that one accounts for different (slowly varying) optical losses in the two output paths of the PBS. This can be achieved by differently amplifying the two photodetector signals such that AC or transient signal components of the amplified signals have equal amplitudes.

If the total Faraday rotator angle $\alpha_{FRM}$ remains constant at 45° (constant temperature), the normalization of the signals from the two photodetectors can also be achieved via a modulation of the light source power. In this case the two photodetector signals can be amplified such that the modulation amplitudes in both channels are the same.

To summarize, the disclosed sensor configuration A solves the issues raised in the previous section:
  The temperature dependence of the Verdet constant is compensated by an intentionally imperfect half-wave retarder.
  Alternatively or in addition, the DC difference of the photodetector signals is used to determine the temperature of the Faraday rotator and thus of the fiber coil which is used for temperature compensation by appropriate signal processing.
  Proper alignment of the sensor head plane with respect to retarder axes minimizes the influence of the bending-induced birefringence. Alternatively, the bending-induced birefringence can be reduced by appropriately adjusting the retarder.
  Comparison of the AC or transient signal components at the two photodetectors enables correction of different optical losses in the two output paths of the PBS.

3. Sensor Configuration B

Figure 7:
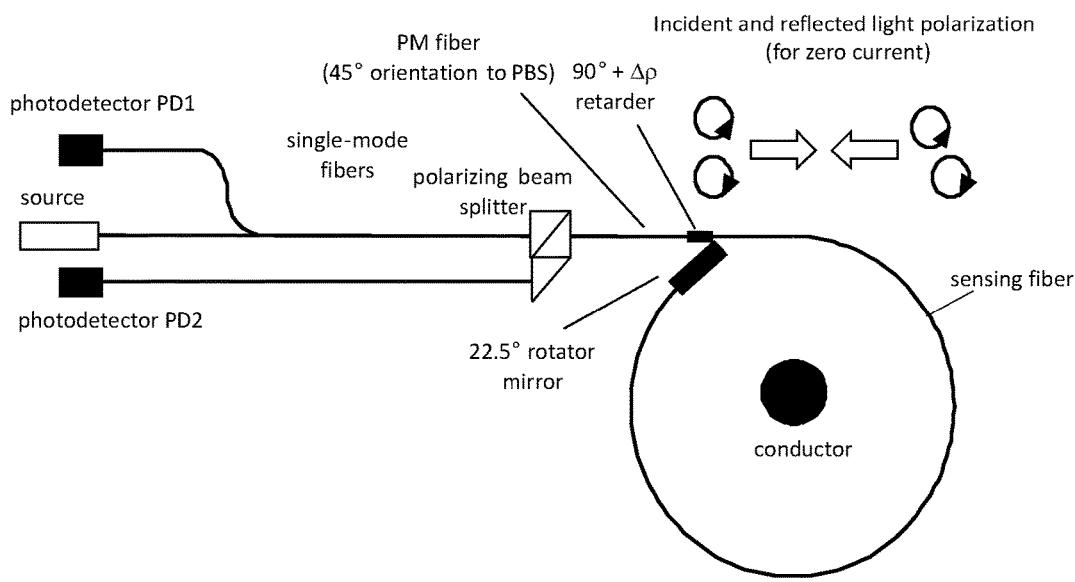
FIG. 7 shows sensor configuration B employing circularly polarized light.

In configuration B (depicted in FIG. 7), incoherent left and right circularly polarized light is used as probe light in the sensing fiber (instead of the linearly or nearly linearly polarized light in configuration A). The circular light waves are produced by a combination of a section of a birefringent PM fiber (or another birefringent element) and a quarter-wave retarder behind the PBS. The PM fiber axes are now aligned at 45° to the principal axes of the PBS and of the quarter-wave retarder. The linear light polarization state at the output of the PBS is decomposed into two orthogonal linear light polarization states parallel to the axes of the PM fiber. The differential group delay of the orthogonal modes in the PM fiber is longer than the light coherence length and, consequently, the two light polarizations have lost their coherence at the end of the PM fiber section. The two incoherent linear light polarizations are converted into left or right circular polarization states by the quarter-wave retarder made, e.g., of a short section of PM fiber. The Faraday rotator at the end of the sensing fiber induces a 90° phase bias between the left and right circular waves in addition to the magneto-optic phase shift induced by the current. The two reflected light waves pass the quarter-wave retarder a second time and are reconverted into orthogonal linear polarization states. The polarization states of the returning waves are swapped with respect to the forward waves. As a result, coherence between the two states is restored when they arrive at the PBS due to compensation of the differential delay on the return path through the PM fiber. The orthogonal polarization states are brought to interference at the PBS. The two resulting anti-phase interference signals are detected by the two photo-detectors PD1 and PD2 and are equivalent to the corresponding signals of sensor configuration A.

In order to compensate for the temperature dependence of the Verdet constant, the retarder is again manufactured with a deviation or detuning $\Delta\rho$ from perfect quarter-wave retardation (analog to the half wave retarder tuning in configuration A): $\rho=90°+\Delta\rho$. In this case the orthogonal light waves returning from the retarder to the PBS also contain components with un-swapped polarization directions. Those components have group delays of $\pm L\Delta n_g$ with respect to the swapped components when arriving at the PBS and therefore add incoherently to the detected signals. Here L and $\Delta n_g$ are the length of the PM fiber section and the group index difference of the orthogonal modes, respectively. (Un-swapped polarization components also occur for a perfect quarter-wave retarder but with non-zero linear birefringence in the sensing fiber).

In this embodiment, the normal of the sensing coil is advantageously oriented at an angle of 45° with respect to the axes of the retarder as this alignment reduces the influence of bend-induced birefringence. A deviation from this optimum orientation can again be compensated by appropriately tuning the retardation of the retarder (see below).

Figure 8A:
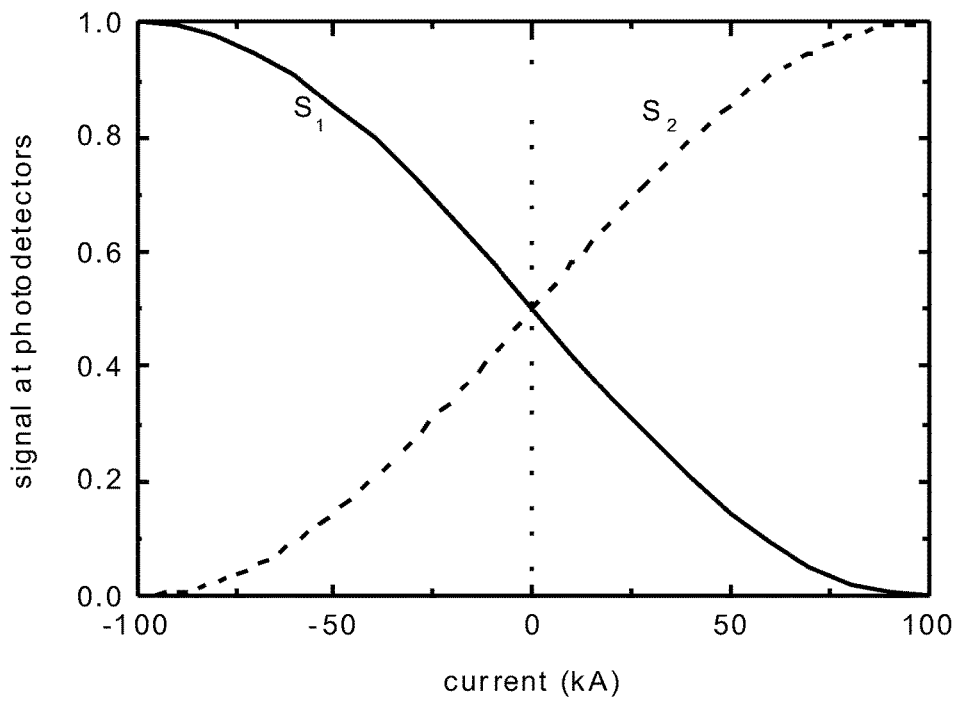
FIG. 8a shows the normalized signal at the two photodetectors as a function of current (configuration B), where the principal axes of the fiber coil are oriented at 45° to the axes of the retarder and where the quarter-wave-retarder is perfect ($\Delta\rho=0$) and no bend-induced birefringence ($\delta=0$) exists, FIG. 8b corresponds to FIG. 8a but represent the situation where the sensor is temperature-compensated ($\Delta\rho=-15°$) and exhibits bend-induced birefringence.

FIG. 8a shows the normalized detected light power at the two photodetectors as a function of current with $\Delta\rho=0$ and $\delta=0$. Here, the maximum currents of ±100 kA correspond to differential magneto-optic phase shifts between the left and right circular light waves of about ±90°.

With the sensor parameters given in the Note 1 in section 1 above, the retardation of the retarder must be chosen as $\rho=75°$ ($\Delta\rho=-15°$) in order to compensate for the temperature dependence of the Verdet constant.

Figure 8B:
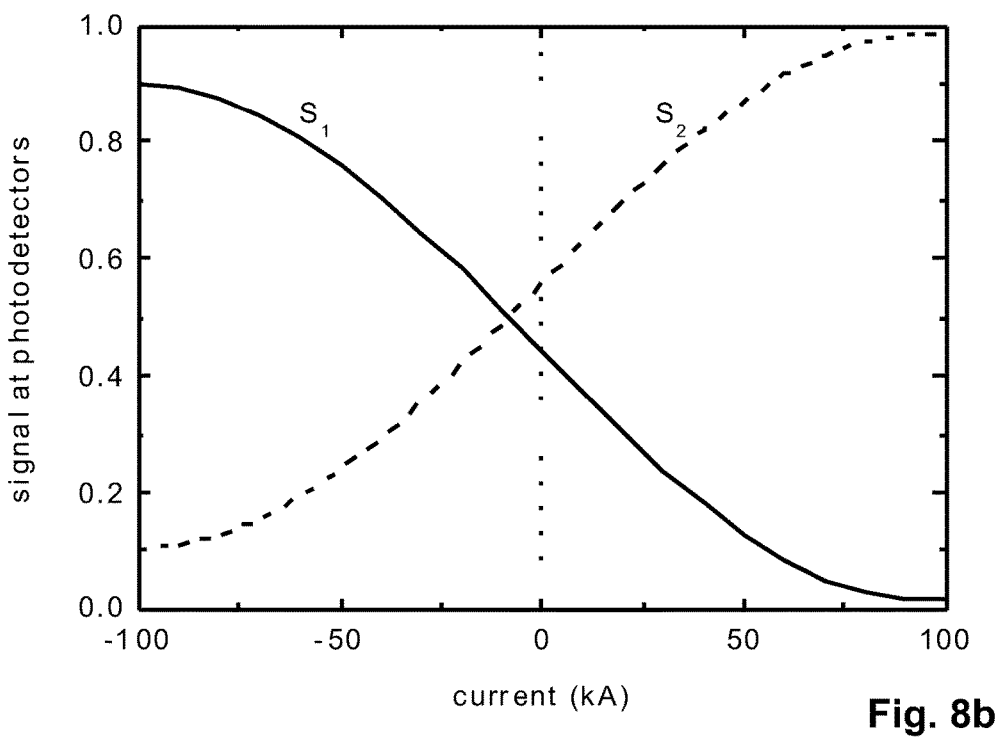

The asymmetry in the two curves for $S_1$ and $S_2$, as shown in FIG. 8b, can be explained as follows: the retarder detuning results in extra coherent and incoherent light wave components that return from the fiber coil to the PBS. The mutual phases of the extra components are different in the two detector channels which then causes the asymmetric responses. An extreme case is a 180°-retarder ($\Delta\rho=90°$) as considered in configuration C below. Here, the intensity ratio of the two channels at zero current is 3:1, which can be explained by a simple vector model for the light waves.

The slope of the curves in FIG. 8b is again maximal at zero current due to phase bias produced by the Faraday rotator.

Figure 9:
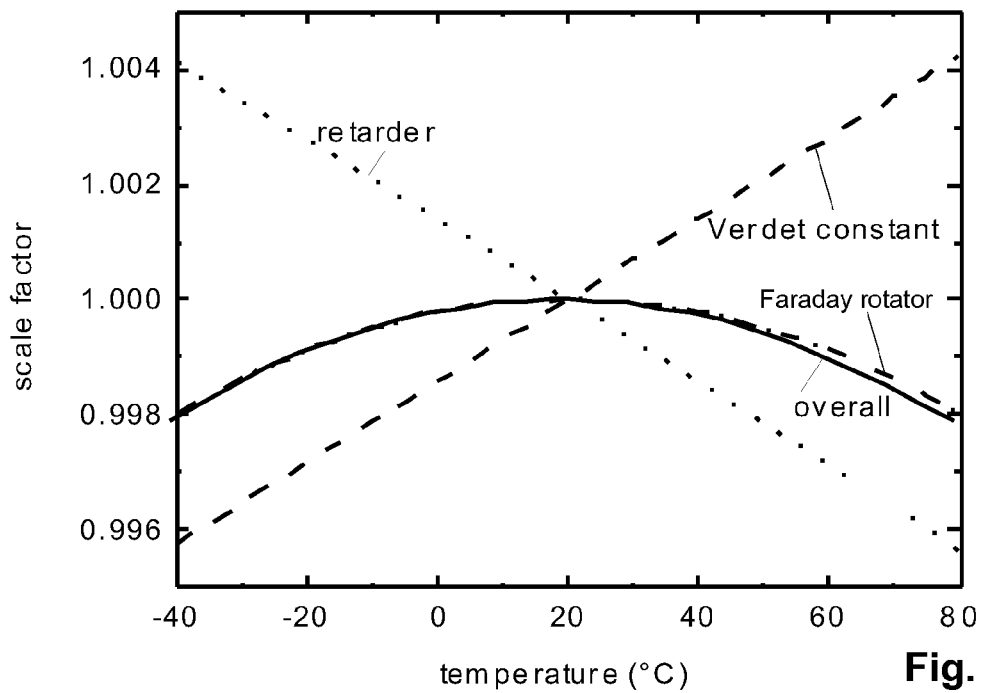
FIG. 9 shows the contributions to the temperature dependence of the scale factor and overall temperature dependence for an AC current measurement with sensor B ($\Delta\rho=-15°$) and a 45° orientation between sensor coil plane and the axes of the retarder.

FIG. 9 depicts the individual contributions to the temperature dependence of the scale factor (i.e. the contributions from the Verdet constant, the retarder, and the Faraday rotator) as well as the overall temperature dependence in the case of $\Delta\rho=-15°$ and 45° angle between the PBS axes and the sensor coil plane. The first order temperature contributions of the Verdet constant and the retarder nearly cancel each other and the overall temperature dependence is mainly given by second order temperature dependence due to the Faraday rotator. A change in the rotation angle with temperature moves the phase bias of the circular waves away from 90°, i.e. the angle of highest sensitivity. The sensor sensitivity then drops in proportion to the cosine of the angle change.

Figure 10:
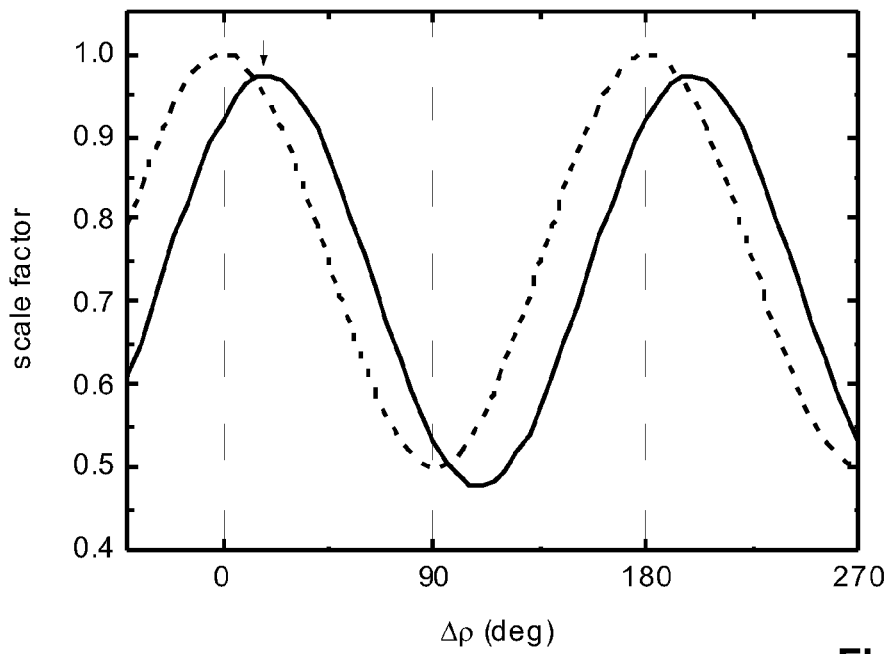
FIG. 10 shows the scale factor of sensor configuration B as a function of deviation from perfect quarter-wave retardation in the presence of bend-induced fiber birefringence if the principal axes of the fiber coil are parallel to the retarder axes (solid line)—the dashed line shows the scale factor in the absence of bend-induced birefringence for comparison—the arrow indicates the value of $\Delta\rho$ that results in the maximum scale factor in the presence of bend-induced birefringence (note: the data are normalized with respect to the case of $\Delta\rho=0$ and $\delta=0$)

If the normal of the sensor coil plane is not aligned at 45° but parallel to an axis of the retarder bend-induced birefringence shifts the optimum working points (i.e. the points of highest sensitivity) away from zero current. This issue can be solved by adequately tuning the retarder: FIG. 10 shows the normalized scale factor at zero current as a function of $\Delta\rho$ without and with bend-induced birefringence (dashed and solid lines respectively). In the absence of bend-induced birefringence, this curve attains its maxima at multiples of 180° retardation. In the presence of bend-induced birefringence maximum sensitivity at zero current is obtained with $\Delta\rho \approx 18°$. By deviating from $\Delta\rho \approx 18°$ by an appropriate amount, compensation of the temperature dependence of the Verdet constant can be achieved equivalently to the case depicted in FIG. 9.

Figure 11:
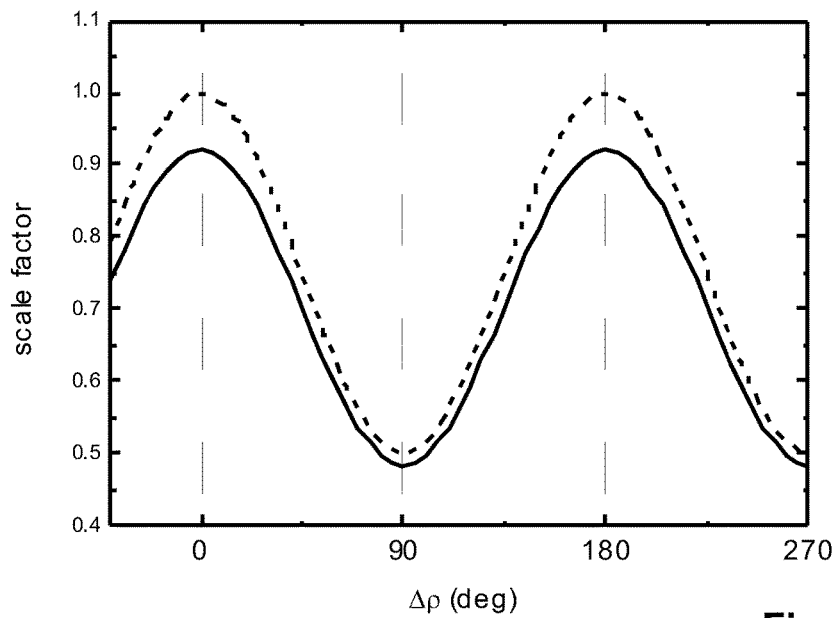
FIG. 11 shows the scale factor as a function of deviation from perfect quarter-wave retardation in the presence of bend-induced fiber birefringence for an angle of 45° between sensor coil plane normal and the retarder axes (solid line)—the dashed line shows the scale factor in the absence of bend-induced birefringence for comparison (note: the data are normalized with respect to the case of $\Delta\rho=0$ and $\delta=0$)
Figure 12:
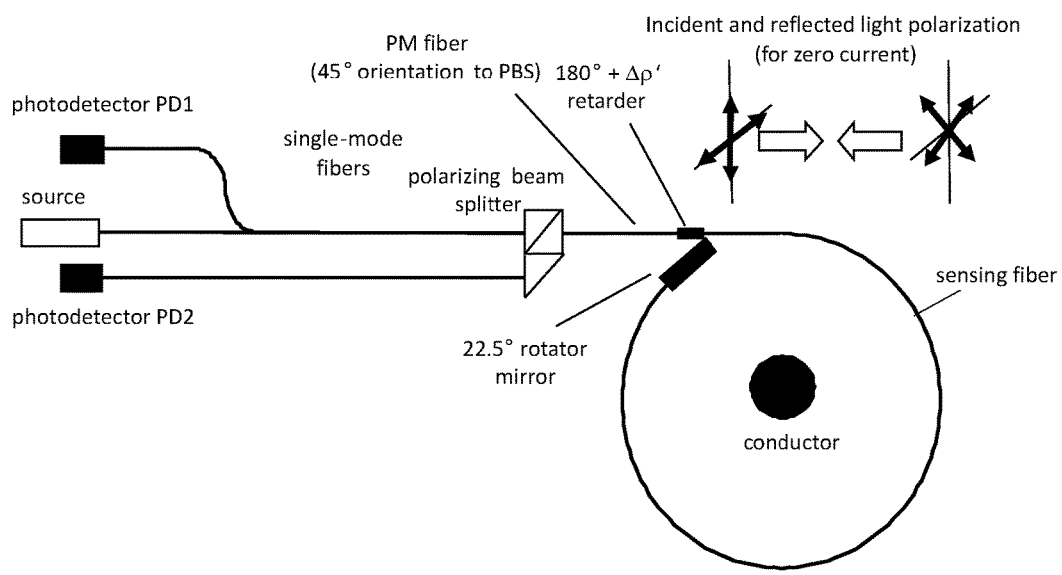
FIG. 12 shows sensor configuration C employing incoherent wave packets of linearly polarized light.

On the other hand, if the coil normal is aligned at 45° to the axes of the retarder optimum sensitivity is reached at $\Delta\rho \approx 0°$ even in the presence of bend-induced birefringence (FIG. 11). Therefore this alignment of the coil normal at 45°, or at least in an angular range of, e.g., ±15° or ±10° or ±5° about 45°, to the axes of the retarder is the preferred one.

4. Sensor Configuration C

Figure 13:
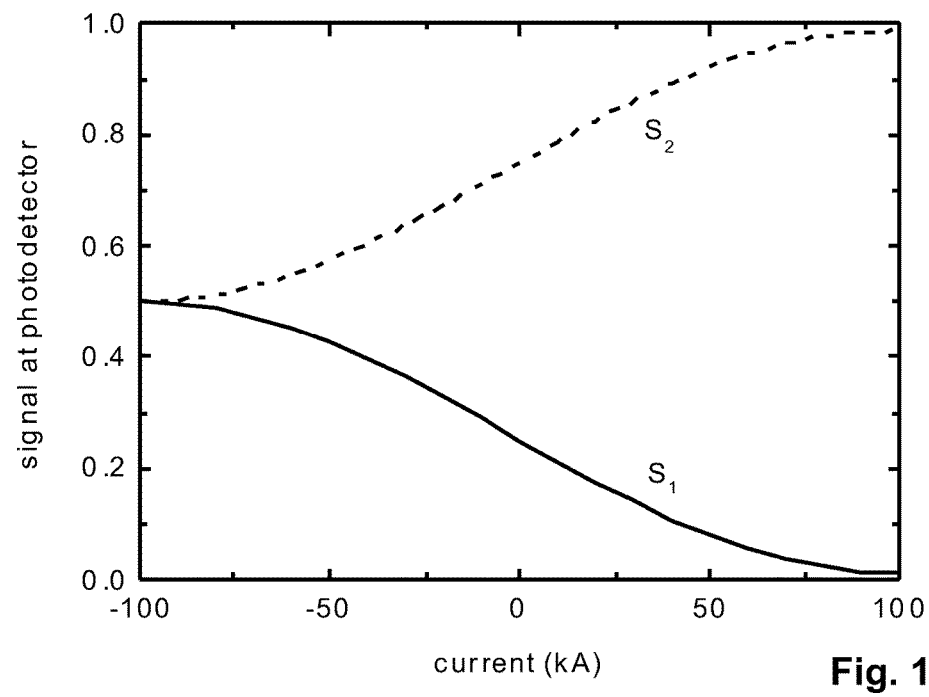
FIG. 13 shows the normalized signal of the two photodetectors as a function of current (configuration C) with $\rho=183.2°$, i.e. $\Delta\rho=3.2°$.
Figure 14:
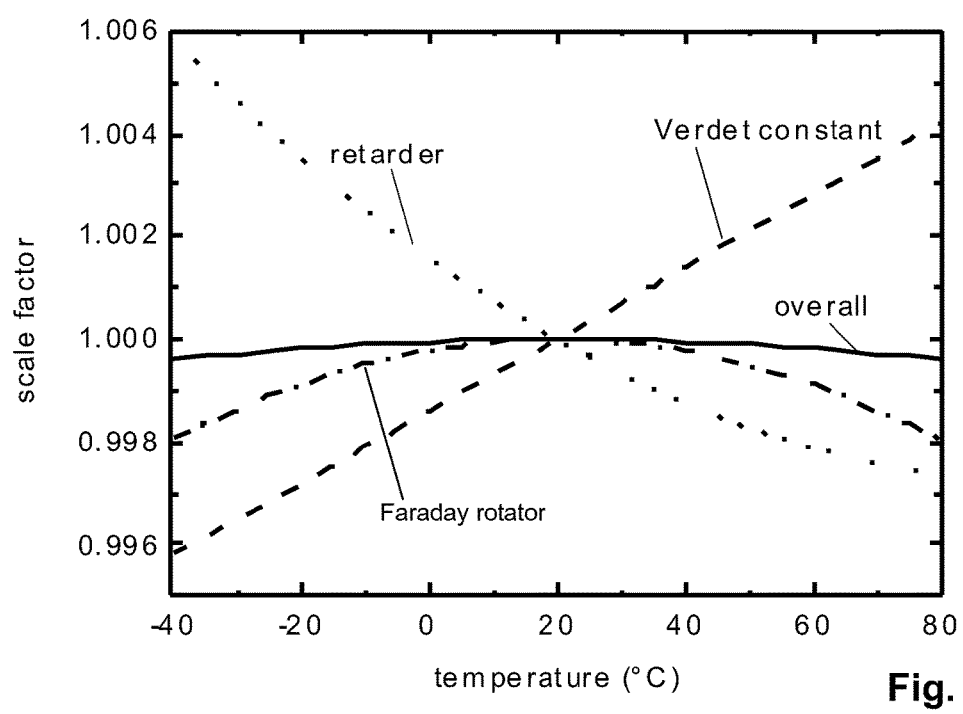
FIG. 14 shows the temperature dependence of the scale factor and individual contributions for an AC current measurement with sensor C ($\rho=183, 2°$, i.e. $\Delta\rho=3.2°$) and a 45° orientation between sensor coil plane and the axes of the retarder.

Configuration C differs from B with respect to the retardance of the retarder, which amounts to $\rho=180°+\Delta\rho$. Here, incoherent wave packets of essentially linear polarization orthogonal to each other are launched into the sensing fiber. In this case, the scale factor is near a minimum (see FIG. 10 and FIG. 13). However, this setup enables a significant reduction of the second order temperature dependence since, in contrast to the other configurations, the second-order contributions from retarder and Faraday rotator have opposite sign. In case of configuration C, a deviation from perfect half-wave retardation increases the scale factor (see FIG. 10, 11) and thus compensates deviations from the ideal working point that decrease the scale factor. Accordingly, with $\rho$ near 180° the retarder contributes with a quadratic term of proper sign to the overall temperature dependence and thus can be utilized to well compensate both the quadratic temperature effect of the Faraday rotator and the linear effect of the Verdet constant. The temperature dependence of the scale factor and the individual contributions are depicted in FIG. 14.

5. Faraday Rotator

Whereas 45°-Faraday rotators (having a polarization rotation of 45° for a single pass of the light) are widely available at various wavelengths of operation for use in optical isolators and Faraday rotator mirrors, 22.5°-rotators are usually no off-the-shelf products. However, since the Faraday effect scales roughly in proportion to the inverse of the wavelength squared, a 45°-Faraday rotator with a specified wavelength of operation of 1550 nm can be utilized for a sensor employing 1310 nm light: In this case, the one-way effective retardation is about 63° and is thus near the angle of $\alpha_{FRM}=22.5°+45°$ which is equivalent to a rotation of 22.5°. Note, however, that the temperature dependence of the rotation angle is higher by a factor of three compared to a true 22.5°-rotator. Furthermore, using a 45°-rotator specified for operation at 820 nm at 1310 nm results in a rotation angle of about 18° and thus is in the vicinity of the ideal angle of 22.5°.

The Faraday rotator in front of the mirror can be replaced by one or several Faraday rotators at any place along the sensing fiber end, as long as the total roundtrip retardation adds up to 45°+M·90°, with M being an integer number. Especially, a possible realization can entail a 22.5° retarder at the beginning of the sensing coil and a 45° Faraday rotation mirror at the end of the sensing fiber [4]. This realization will reduce the influence from the bend-induced birefringence in the sensing fiber.

Since the rotator is exposed to the magnetic field of the current conductor, it is important that the rotator is shielded against the field by a suitable magnetic shield or that the magnetic field exerted to the high-V glass slab is significantly higher than the saturating magnetic field of this glass plus any possible magnetic field resulting from the electrical current.

6. Fibers and Connectors

A particular advantage of the above sensor configurations compared to interferometric sensors according to Ref. 1 is that standard single-mode fibers rather than polarization-maintaining fibers transmit the light from the source to sensor head and back to the photo-detectors. Therefore, standard low-cost fiber-connectors can be used instead of polarization-maintaining connectors in order to make the sensor modular and facilitate the installation process.

7. Depolarizer

Typically, the light source emits light with a certain degree of polarization. Without further measures the polarization state of light may randomly vary when the light propagates from the source to the sensor head. In order to avoid polarization-dependent loss (particularly at the input port of the polarizing splitter) and resulting instabilities in the signals, a fiber Lyot depolarizer is advantageously used to depolarize the source light. For similar reasons depolarizers may also be placed into both detection channels near the PBS to depolarize the returning light after it has passed the PBS.

8. Some Possible Modifications

The PBS of the configurations presented above may be replaced by a polarization-maintaining fiber coupler and a fiber polarizer at each of the two detector ports. The polarization directions are orthogonal to each other, i.e. at one port the polarization is parallel to fast axis of the coupler pigtail and parallel to the slow axis at the other port. This modification is more compact and has potentially lower insertion loss and better thermal stability.

The low-birefringent single-mode sensing fiber mentioned above can be replaced by a spun birefringent fiber [11]. In this type of fiber the polarization of the light is more robust against external stress, e.g. from fiber bending, fiber coating, or from packaging.

The retarder may be fabricated from different types of polarization-maintaining fiber (e.g. from fibers with internal stress bodies, micro-structured fibers, or elliptical-core fibers). The fibers have different temperature dependence of their birefringence and thus may be selected to achieve optimum temperature compensation. Also, multiple order retardation (i.e. N>0) can be employed to increase the temperature response of the retarder, if desired.

As the bend-induced birefringence $\delta$ of a fused silica is also temperature dependent ($6 \cdot 10^{-4} K^{-1}$[12]), this will also influence the sensor signal. The retarder can be tuned so that it compensates not only the temperature dependence of the Verdet constant (and the Faraday rotator) but also the influence on the scale factor of the temperature dependence of the bend-induced birefringence δ.

The nonlinear sensor response at larger currents can be made linear in the signal processor by means of a look-up table or polynomials.

If the sensor is operated within a relatively small temperature range (and thus with only small variations in the working point with temperature) it may be sufficient to work with a single detection channel. Preferably the PBS is then replaced by an in-line fiber polarizer.

9. Further Notes

Some further objects achieved by the embodiments described above include:

Sensor configurations with passive phase bias (working point adjustment) by means of a Faraday rotator are provided.

An intrinsic compensation of the temperature dependence of the Faraday effect in the sensing fiber as well as in the Faraday rotator is achieved.

Alternatively, a method to extract the sensing fiber coil temperature from the optical signals and to compensate effects of temperature in the signal processor is provided.

Means for compensating the bend-induced birefringence in the sensing fiber coil are provided.

The different optical power losses in the detection channels can be compensated for.

Measurements with accuracy to within <±1% can be achieved (sufficient for protection applications in power transmission and distribution).

Standard fibers can be used between opto-electronics module and the sensing fiber coil.

Sensors using inexpensive commercially available components are provided.

In general, a 22.5° Faraday rotator, which is part of the sensing coil, determines the working point of the sensor. The coil is operated with substantially linearly polarized light or incoherent substantially left and substantially right circularly polarized light waves. In an advantageous arrangement, a polarization beam splitter generates two optical signals that vary in anti-phase with changing current. A signal processor determines the current from the two anti-phase signals. Appropriately detuned fiber-optic half-wave or quarter-wave retarders before the fiber coil are employed to cancel the effects of temperature and bend-induced birefringence. Moreover, the temperature may be derived from the difference in the bias of the anti-phase signals and used to cancel temperature effects in the signal processor.

REFERENCES

1. G. Frosio and R. Dändliker, Reciprocal reflection interferometer for a fiber-optic Faraday effect current sensor, Appl. Opt. 33(25), 6111 (1994).
2. "The fiber-optic gyroscope", Herve Lefevre, Artech House, Boston, London, 1993.
3. EP 2010925, Fiber-Optic current sensor with polarimetric detection scheme.
4. F. Briffod et al., Polarimetric current sensor using in-line Faraday rotator, IEICE Trans. Electron., E83-C, 331 (2000).
5. K. Kurosawa et al., Flexible fiber Faraday effect current sensor using flint glass fiber and reflection scheme, IEICE Trans. Electron., E83-C, 326 (2000) and Optical Fibre Sensors Conference 13, 1999 Apr. 12-16, 1999, Kyongju, Korea.
6. H. Lin et al., Modified in-line Sagnac interferometer with passive demodulation technique for environmental immunity of a fiber-optic current sensor, Appl. Opt. 38, 2760 (1999).
7. US2007/0273358A1 (PCT/JP05/15004): Method for reducing temperature dependent error in photocurrent sensor and photocurrent sensor device.
8. US2010/0253320A (PCT/JP2008/057933): Optical fiber electric current sensor and electric current measurement method.
9. EP 1115000
10. R. C. Jones, A new calculus for the treatment of optical systems, J. Opt. Soc. Am. 31, 488 (1941).
11. R. I. Laming and D. N. Payne, Electric current sensors employing spun highly birefringent optical fibers, J. Lightw. Technol., 7, 2084 (1989).
12. Z. B. Ren, P. Robert, and P.-A. Paratte, Temperature dependence of bend- and twist-induced birefringence in a low-birefringence fiber, Opt. Lett. 13, 62, (1988).

What is claimed is:

1. A current sensor comprising:
   a light source,
   a first linear polarizer receiving light from the light source and generating polarized light, and
   a sensor head with
   a retarder receiving light from the first linear polarizer and having a retardation of $90°+\Delta\rho+N\cdot180°$ or $180°+\Delta\rho+N\cdot180°$ with retarder detuning $\Delta\rho\neq0$ and N being an integer number $\geq0$,
   wherein the retarder detuning $|\Delta\rho|$ is in a range of 1° to 30° and serves for reducing a temperature-dependence in the measurement signal,
   a sensing fiber arranged to receive light from the retarder, wherein the sensing fiber is adapted to be looped at least once around a conductor carrying a current to be measured,
   a mirror arranged to receive light from the sensing fiber, and
   a Faraday rotator arranged between the retarder and the mirror, wherein the Faraday rotator rotates the light by $(22.5°+M\cdot45°)\pm10°$, with M being an integer number $\geq0$,
   the current sensor further comprising at least one detector adapted to measure at least one signal of light returning from the sensor head through the first linear polarizer.

2. The current sensor of claim 1, wherein retarder detuning $|\Delta\rho|$ is between 1° and 15° and serves for reducing a temperature-dependence in the measurement signal.

3. The current sensor of claim 1, wherein a retardation, in particular a length, of the retarder is such that it compensates at least partially for a temperature dependence of a Verdet constant of the sensing fiber.

4. The current sensor of claim 3, wherein the retardation of the retarder further compensates at least partially for a temperature dependence of a birefringence of the sensing fiber and/or of a rotation angle generated by the Faraday rotator.

5. The current sensor of claim 1, wherein the retarder has a retardation of $180°+\Delta\rho+N\cdot180°$.

6. The current sensor of claim 5, wherein the retarder has principal axes arranged at an angle 45°±10° in respect to a polarization direction of the polarized light, and in particular wherein the polarized light is incident on the retarder.

7. The current sensor of claim 1, further comprising a birefringent element arranged between the polarizer and the retarder, with the birefringent element having principal axes arranged at 45°±10° with respect to a polarization direction of the polarized light, wherein the birefringent element introduces a differential group delay exceeding a coherence length of the light, and wherein the retarder has principal axes arranged at an angle of 45°±10° with respect to the principal axes of the birefringent element.

8. The current sensor of claim 7, wherein the retarder has a retardation of 180°+Δρ+N·180° and wherein a retardation, in particular a length, of the retarder is such that it compensates at least partially for a temperature dependence of a Verdet constant of the sensing fiber and a temperature dependence of a rotation angle generated by the Faraday rotator.

9. The current sensor of claim 8, wherein the retardation of the retarder further compensates at least partially for a temperature dependence of a birefringence of the sensing fiber.

10. The current sensor of claim 8, wherein the birefringent element is a birefringent polarization-maintaining fiber.

11. The current sensor of claim 7, wherein the retarder has a retardation of 90°+Δρ+N·180°, with N being an integer larger or equal to 0.

12. The current sensor of claim 11, wherein the birefringent element is a birefringent polarization-maintaining fiber.

13. The current sensor of claim 7, wherein the birefringent element is a birefringent polarization-maintaining fiber.

14. The current sensor of claim 1, wherein the sensing fiber is arranged in a plane, wherein a normal to the plane is at an angle of 45°±15° to the principal axes of the retarder.

15. The current sensor of claim 1 further comprising
a second linear polarizer,
a first photodetector adapted to measure at least one signal of light returning from the sensor head through the first linear polarizer,
and a second photodetector adapted to measure at least one signal of light returning from the sensor head through the second linear polarizer,
wherein the first linear polarizer and the second linear polarizer have polarization directions orthogonal to each other.

16. The current sensor of claim 1, wherein N>0.

17. A method for current measurement, in particular for using a current sensor of claim 1, the method comprising the method elements of:
transmitting light from a light source through a first linear polarizer to a linear retarder and therefrom, in forward direction and upon reflection at a mirror in backward direction, through a Faraday rotator and a sensing fiber which is arranged around a current-carrying conductor, wherein the Faraday rotator rotates the light by (22.5°+M·45°)±10°, with M being an integer number ≥0,
in the retarder retarding the light by a retardation of 90°+Δρ+N·180° or 180°+Δρ+N·180° with retarder detuning Δρ≠0° and N being an integer number ≥0, and
detecting the light returning through the first linear polarizer, further comprising the method element of
selecting the retarder detuning Δρ to be non-vanishing such that a temperature-dependence in the measurement signal is reduced.

18. The method for current measurement according to claim 17, further comprising the method element of:
selecting an absolute value of the retarder detuning |Δρ| in a range of 1° to 30° for compensating at least partially for a temperature dependence of a Verdet constant of the sensing fiber.

19. The method according to claim 18, where the absolute value of the retarder detuning |Δρ| is between 1° to 15°.

20. The method according to claim 18, wherein the retarder further compensates at least partially for a temperature dependence of a birefringence of the sensing fiber and/or of a rotation angle generated by the Faraday rotator.

* * * * *